United States Patent
Lin

(10) Patent No.: US 12,094,991 B2
(45) Date of Patent: Sep. 17, 2024

(54) HYBRID DENSE SOLAR CELLS AND INTERCONNECTS FOR SOLAR MODULES AND RELATED METHODS OF MANUFACTURE

(71) Applicant: MAXEON SOLAR PTE. LTD., Marina Bay Financial Centre (SG)

(72) Inventor: Yafu Lin, San Jose, CA (US)

(73) Assignee: MAXEON SOLAR PTE. LTD., Marina Bay Financial Centre (SG)

( * ) Notice: Subject to any disclaimer, the term of this patent is extended or adjusted under 35 U.S.C. 154(b) by 0 days.

(21) Appl. No.: 16/682,867

(22) Filed: Nov. 13, 2019

(65) Prior Publication Data
US 2021/0143290 A1    May 13, 2021

(51) Int. Cl.
| | |
|---|---|
| *H01L 31/05* | (2014.01) |
| *H01L 31/02* | (2006.01) |
| *H01L 31/0224* | (2006.01) |
| *H01L 31/18* | (2006.01) |

(52) U.S. Cl.
CPC ...... *H01L 31/0508* (2013.01); *H01L 31/0201* (2013.01); *H01L 31/022433* (2013.01); *H01L 31/18* (2013.01)

(58) Field of Classification Search
CPC .......... H01L 31/02008–02013; H01L 31/022425–022433; H01L 31/05–0512; H01L 31/0201; H01L 31/0508
See application file for complete search history.

(56) References Cited

U.S. PATENT DOCUMENTS

| | | | | |
|---|---|---|---|---|
| 4,617,421 A | * | 10/1986 | Nath | ............... H01L 31/0445 136/258 |
| 9,722,117 B1 | | 8/2017 | Jiang et al. | |
| 2008/0035198 A1 | * | 2/2008 | Teppe | ............ H01L 31/022458 257/E33.001 |

(Continued)

FOREIGN PATENT DOCUMENTS

| | | |
|---|---|---|
| CN | 208189602 U | 12/2008 |
| CN | 107706258 A | 2/2018 |

(Continued)

OTHER PUBLICATIONS

Machine translation of CN 108711582 A.*

(Continued)

*Primary Examiner* — Jayne L Mershon
(74) *Attorney, Agent, or Firm* — Oblon, McClelland, Maier & Neustadt, L.L.P.

(57) ABSTRACT

A solar module includes at least one first solar cell and at least one second solar cell, each solar cell including a top side and bottom side, a bus bar, and a plurality of wires, disposed on the top side, extending from and electrically connected to the bus bar. The first solar cell overlaps a region of the second solar cell to electrically connect to the second solar cell and to form a shingled arrangement, and in the second solar cell, the plurality of wires connect to the bus bar outside of the region in which the first solar cell overlaps the second solar cell. A method of manufacturing a solar module includes shingling solar cells using ECA to make a hybrid dense solar cell string that includes at least two hybrid dense solar cells in a shingled arrangement.

16 Claims, 16 Drawing Sheets

(56) References Cited

U.S. PATENT DOCUMENTS

| | | | | |
|---|---|---|---|---|
| 2010/0144218 | A1* | 6/2010 | Rose | H01L 31/0516 |
| | | | | 439/883 |
| 2010/0200045 | A1* | 8/2010 | Mitchell | H02S 40/22 |
| | | | | 136/246 |
| 2012/0318351 | A1* | 12/2012 | Pfennig | H01L 31/022433 |
| | | | | 136/256 |
| 2013/0333744 | A1* | 12/2013 | Yokochi | C09J 9/02 |
| | | | | 136/244 |
| 2014/0124014 | A1* | 5/2014 | Morad | H01L 31/035281 |
| | | | | 136/246 |
| 2017/0077343 | A1 | 3/2017 | Morad et al. | |
| 2017/0125619 | A1* | 5/2017 | Nakano | H01L 31/022433 |
| 2017/0162736 | A1* | 6/2017 | Sethi | H01L 31/0512 |
| 2017/0243986 | A1 | 8/2017 | Lin et al. | |
| 2017/0301801 | A1 | 10/2017 | Nguyen | |

FOREIGN PATENT DOCUMENTS

| | | |
|---|---|---|
| CN | 207068877 U | 3/2018 |
| CN | 108091705 A | 5/2018 |
| CN | 207490855 U | 6/2018 |
| CN | 106384750 B | 7/2018 |
| CN | 108428751 A | 8/2018 |
| CN | 108461577 A | 8/2018 |
| CN | 108538948 A | 9/2018 |
| CN | 108550638 A | 9/2018 |
| CN | 207869063 U | 9/2018 |
| CN | 108649090 A | 10/2018 |
| CN | 108711582 A | 10/2018 |
| CN | 208189604 U | 12/2018 |
| CN | 208256683 U | 12/2018 |
| CN | 208352314 U | 1/2019 |
| CN | 109301009 A | 2/2019 |
| CN | 208570638 U | 3/2019 |
| CN | 208637431 U | 3/2019 |
| CN | 109616540 A | 4/2019 |
| CN | 208753337 U | 4/2019 |
| CN | 208753340 U | 4/2019 |
| CN | 109713066 A | 5/2019 |
| CN | 109728107 A | 5/2019 |
| CN | 208923172 U | 5/2019 |
| CN | 110047945 A | 7/2019 |
| CN | 110061081 A | 7/2019 |
| CN | 209087881 U | 7/2019 |
| CN | 209184552 U | 7/2019 |
| CN | 3 525 245 A1 | 8/2019 |
| CN | 110085696 A | 8/2019 |
| CN | 110112244 A | 8/2019 |
| CN | 110137290 A | 8/2019 |
| CN | 110137291 A | 8/2019 |
| CN | 110137292 A | 8/2019 |
| CN | 110137303 A | 8/2019 |
| CN | 110148641 A | 8/2019 |
| CN | 110190145 A | 8/2019 |
| CN | 209217000 U | 8/2019 |
| CN | 209217001 U | 8/2019 |
| CN | 209328911 U | 8/2019 |
| CN | 209328925 U | 8/2019 |
| CN | 110212049 A | 9/2019 |
| CN | 110246912 A | 9/2019 |
| CN | 209357733 U | 9/2019 |
| CN | 209374460 U | 9/2019 |
| CN | 110379891 A | 10/2019 |
| CN | 209526092 U | 10/2019 |
| CN | 209526093 U | 10/2019 |
| CN | 209526100 U | 10/2019 |
| CN | 209526102 U | 10/2019 |
| CN | 110491959 A | 11/2019 |
| CN | 209607753 U | 11/2019 |
| CN | 209804673 U | 12/2019 |
| CN | 209804688 U | 12/2019 |
| CN | 110677101 A | 1/2020 |
| CN | 209896084 U | 1/2020 |
| CN | 110828608 A | 2/2020 |
| CN | 210110814 U | 2/2020 |
| CN | 210123735 U | 3/2020 |
| CN | 210246656 U | 4/2020 |
| CN | 210257610 U | 4/2020 |
| CN | 210379065 U | 4/2020 |
| EP | 3 190 630 A1 | 7/2017 |
| KR | 10-2019-0120599 A | 10/2019 |
| TW | 201537758 A | 10/2015 |
| WO | WO 2015/183827 A2 | 12/2015 |
| WO | WO 2016/090332 A1 | 6/2016 |
| WO | WO 2019/062758 A1 | 4/2019 |

OTHER PUBLICATIONS

Machine translation of CN 209526092 U.*
Machine translation of CN 209526100 U.*
SNEC 2019: LONGi Solar to mass produce Seamless Soldering cell interconnect technology (printed Aug. 16, 2019) https://www.pv-tech.org/news/snec-2019-longi-solar-to-mass-produce-seamless-soldering-cell-interconnect (2 pages).
Extended European Search Report issued Feb. 16, 2021 in European Patent Application No. 20192295.2, citing documents AA, AB, AO, and AP therein, 6 pages.
Combined Chinese Office Action and Search Report issued Dec. 28, 2023, in corresponding Chinese Patent Application No. 202010311709.9 (with English Translation) citing documents 1, 15 and 16 therein, 19 pages.
Office Action issued Jul. 3, 2024 in Chinese Patent Application No. 202010311709.9.

* cited by examiner

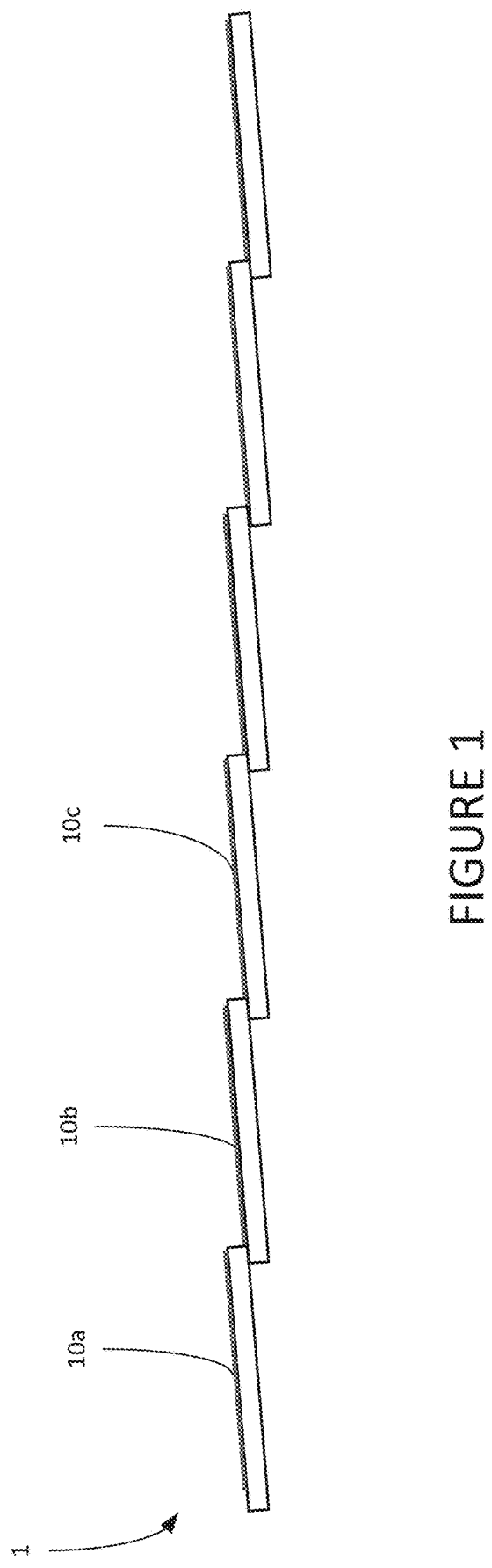

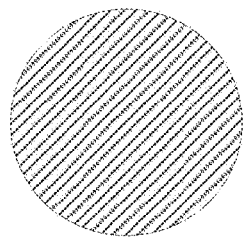
FIGURE 7

FIGURE 9
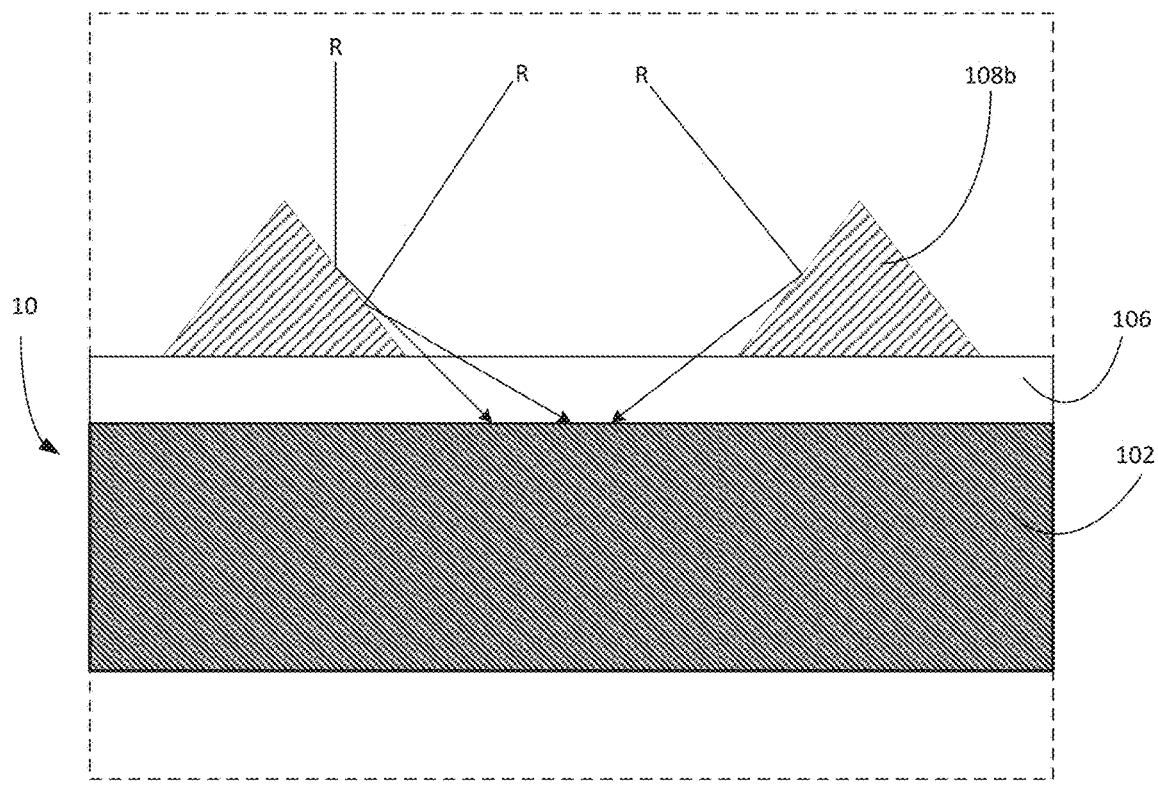

HYBRID DENSE SOLAR CELLS AND INTERCONNECTS FOR SOLAR MODULES AND RELATED METHODS OF MANUFACTURE

STATEMENT REGARDING FEDERALLY SPONSORED RESEARCH OR DEVELOPMENT

This invention was made with government support under DE-EE0007190 awarded by The U.S. Department of Energy. The government has certain rights in the invention.

FIELD

This disclosure relates generally to solar cell modules, methods of making solar cell modules, and a series of the solar cells arranged in a shingled manner.

BACKGROUND

Alternate sources of energy are needed to satisfy ever increasing world-wide energy demands. Solar energy resources are sufficient in many geographical regions to satisfy such demands, in part, by provision of electric power generated with solar (e.g., photovoltaic) cells.

To faster achieve widespread adoption of electric power generated with solar cells, more efficient, and less costly solar cells are required. Conventional solar cells and conventional methods of producing solar cells rely on high cost materials which unnecessarily increase the cost of the produced cells. An alternate approach that utilizes a mix of materials that maintains or improves upon the efficiency of the solar cells is needed.

SUMMARY

Hybrid dense solar cells and interconnects for solar cell modules and methods of making such devices are described herein.

In one exemplary aspect, a solar module includes at least one first solar cell and at least one second solar cell, each including: a top side and bottom side, a bus bar, and a plurality of wires, disposed on the top side, extending from and electrically connected to the bus bar, wherein the first solar cell overlaps a region of the second solar cell to electrically connect to the second solar cell and to form a shingled arrangement, and in the second solar cell, the plurality of wires connect to the bus bar outside of the region in which the first solar cell overlaps the second solar cell.

In one exemplary aspect, the bus bar of the first solar cell and the bus bar of the second solar cell are composed of a first metal and the plurality of wires are composed of a second metal different than the first metal.

In one exemplary aspect, the plurality of wires are made of copper metal or alloys thereof.

In one exemplary aspect, the bus bar is made of silver metal or alloys thereof.

In one exemplary aspect, each bus bar includes a plurality of loading pads, and each wire of the plurality wires is connected to a loading pad of the plurality of loading pads.

In one exemplary aspect, each loading pad includes a main portion that is disposed within the overlapping region and an extending portion that is at least partially disposed outside of the overlapping region, and each wire of plurality of wires connects to the extending portion of the respective loading pad.

In one exemplary aspect, the extending portion of each loading pad extends away from the main portion of the loading pad.

In one exemplary aspect, the bus bar includes a first portion that extends between the main portions of the loading pads and each main portion of the loading pad has a larger width than the first portion of the bus bar.

In one exemplary aspect, each solar cell further includes a plurality of fingers extending in a direction perpendicular to the plurality of wires, and the plurality of wires have an electrical resistance that is smaller than an electrical resistance of the fingers.

In one exemplary aspect, each solar cell further includes a plurality of fingers extending in a direction perpendicular to the plurality of wires; and wherein the plurality of fingers are composed of a first metal and the plurality of wires are composed of a second metal different than the first metal.

In one exemplary aspect, each solar cell further includes a plurality of fingers extending in a direction perpendicular to the plurality of wires; and wherein spacing between the plurality of fingers is smaller than a spacing between adjacent wires of the plurality of wires.

In one exemplary aspect, an electrically conductive adhesive connects the first solar cell to the second solar cell in the region.

In one exemplary aspect, each of the plurality of wires has a circular cross sectional shape.

In one exemplary aspect, each of the plurality of wires has a triangular cross sectional shape.

In one exemplary aspect, each wire of the plurality of wires is oriented to contact the plurality of fingers with a base of the triangular cross-sectional shape.

In one exemplary aspect, the plurality of wires extend substantially perpendicular to the bus bar.

In one exemplary aspect, a method of manufacturing a solar module includes: providing at least one first solar cell and at least one second solar cell, each including: a top side and bottom side, a bus bar, and a plurality of wires, disposed on the top side, extending from and electrically connected to the bus bar; and arranging the first solar cell to overlap a region of the second solar cell to electrically connect to the second solar cell and to form a shingled arrangement, wherein, in the second solar cell, the plurality of wires connect to the bus bar outside of the region.

In one exemplary aspect, the method further includes attaching each wire of the plurality of wires to the respective solar cell using infrared radiation (IR) soldering.

In one exemplary aspect, the method further includes printing electrically conductive adhesive over the plurality of wires to attach each of the plurality of wires to the respective solar cell.

In one exemplary aspect, the method further includes coating each of the plurality of wires with a coating material; and heating the coating material to attach the plurality of wires to the solar cell.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings, wherein:

FIG. 1 is a side view of hypercell formed of a string of shingled hybrid dense solar cells, according to exemplary aspects of the disclosure;

FIG. 7 illustrates a circular cross sectional shape of a wire, according to exemplary aspects of the disclosure;

FIG. 9 is an enlarged cross sectional view of an hybrid dense solar cell with the triangular cross sectional shape wires of FIG. 8, according to exemplary aspects of the disclosure;

DETAILED DESCRIPTION

Figure 2A:
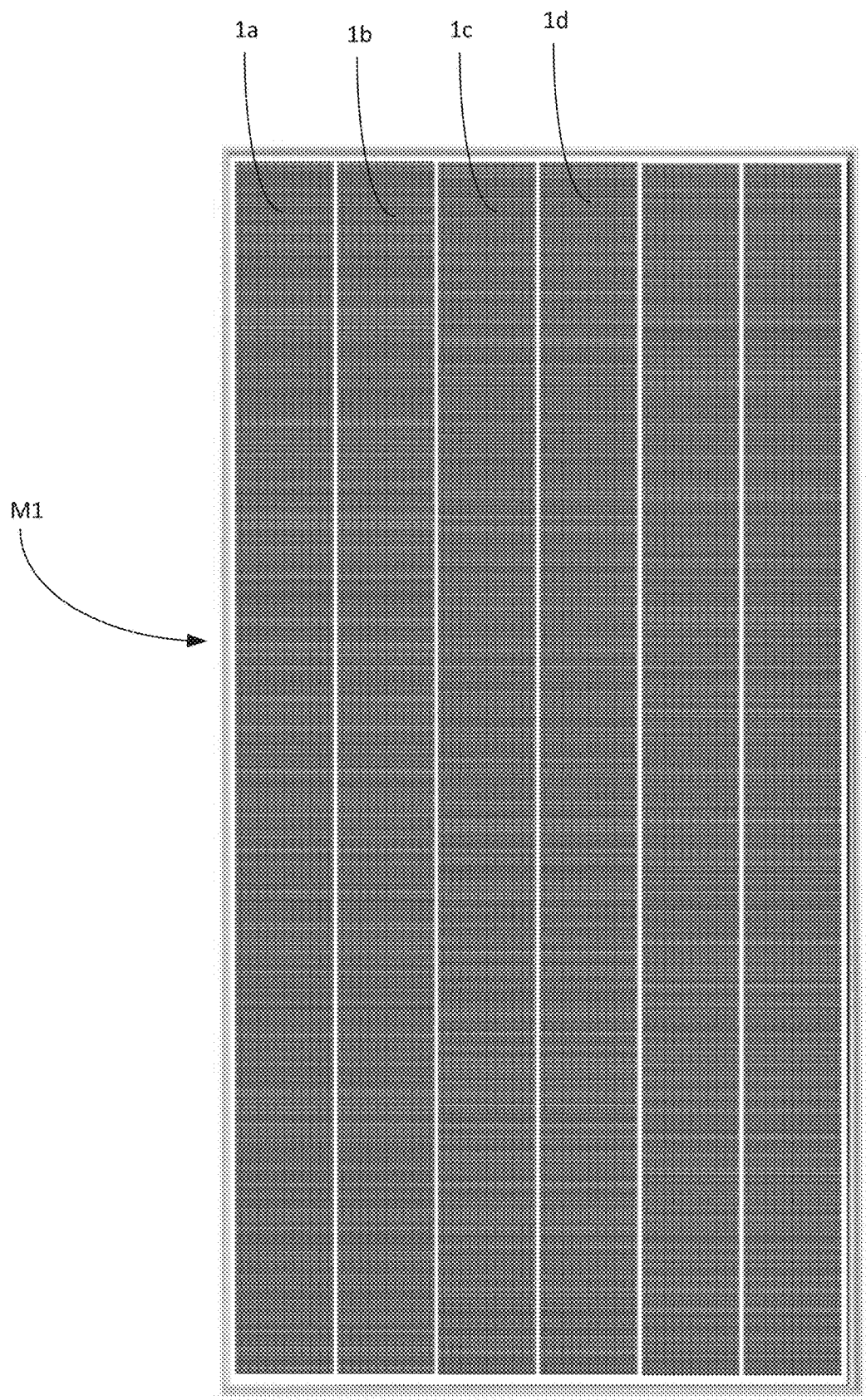
FIG. 2a illustrates a front view of a first solar module that includes multiple interconnected hypercells, according to exemplary aspects of the disclosure.

The following detailed description should be read with reference to the drawings, in which identical reference numbers refer to like elements throughout the different figures. The drawings, which are not necessarily to scale, depict exemplary aspects and are not intended to limit the scope of this disclosure. The detailed description illustrates by way of example, not by way of limitation, the exemplary principles that enable one skilled in the art to make and use devices and methods defined by the claims. Of course, numerous variations and permutations of the features described herein are embraced by this disclosure, and the appended claims, as one of ordinary skill in the art would recognize.

As used in this specification and the appended claims, the singular forms "a," "an," and "the" include plural referents unless the context clearly indicates otherwise. Also, the term "parallel" is intended to mean "parallel or substantially parallel" and to encompass minor deviations from parallel geometries rather than to require that any parallel arrangements described herein be exactly parallel. The term "perpendicular" is intended to mean "perpendicular or substantially perpendicular" and to encompass minor deviations from perpendicular geometries rather than to require that any perpendicular arrangement described herein be exactly perpendicular. The term "square" is intended to mean "square or substantially square" and to encompass minor deviations from square shapes, for example substantially square shapes having chamfered (e.g., rounded or otherwise truncated) corners. The term "rectangular" is intended to mean "rectangular or substantially rectangular" and to encompass minor deviations from rectangular shapes, for example substantially rectangular shapes having chamfered (e.g., rounded or otherwise truncated) corners.

This specification describes high efficiency hybrid dense solar cells ("HDSC"), HDSC interconnects, and series-connected HDSC strings or "hypercells," as well as front and rear surface metallization patterns and associated interconnects for solar cells that may be used in such arrangements. This specification also describes methods for manufacturing HDSCs, HDSC interconnects and strings or hypercells. The solar cell modules may be advantageously employed under "one sun" (non-concentrating) illumination, and may have physical dimensions and electrical specifications allowing them to be substituted for crystalline silicon solar cell modules.

The specification also describes "electrical connection" between two or more objects or that two or more elements may be in "electrical connection." Electrical connection is established between two or more conductive material such that electrons can substantially freely flow through the materials in a given direction when subjected to an electrical load. In other words, two elements are considered to be in electrical connection when an electrical current can flow readily therethrough.

FIG. 1 illustrates a hypercell 1 that includes a plurality of hybrid dense solar cells 10 in a shingled arrangement according to exemplary aspects of the disclosure. Each solar cell 10a, 10b, 10c includes a semiconductor diode structure and electrical contacts to the semiconductor diode structure by which electric current generated in solar cells 10, when they are illuminated by light, may be provided to an external load.

In one or more examples described in this specification, each solar cell 10 is a crystalline silicon solar cell having front surface and rear surface metallization patterns providing electrical contact to opposite sides of an n-p junction. The front surface metallization pattern is disposed on a semiconductor layer of n-type conductivity, and the rear surface metallization pattern is disposed on a semiconductor layer of p-type conductivity. However, any other suitable solar cells employing any other suitable material system, diode structure, physical dimensions, or electrical contact arrangement may be used instead of or in addition to solar cell 10 in the solar modules described in this specification. For example, the front (sun side) surface metallization pattern may be disposed on a semiconductor layer of p-type conductivity, and the rear surface metallization pattern disposed on a semiconductor layer of n-type conductivity.

With reference to FIG. 1, the hypercell 1 may include series-connected string of shingled solar cells 10 such that a first solar cell 10a is positioned to at least partially overlap at least a portion of a second solar cell 10b which is positioned to at least partially overlap a third solar cell 10c, and so on (not all solar cells are labelled). The extent of overlap can vary without departing from the scope of the disclosure. For example, the first solar cell 10a may overlap the second solar cell 10b by substantially 2%-6% of the length of the solar cell 10a or less. Further, the solar cell 10a may overlap the second solar cell 10b by more than 2%-6% or any amount therebetween, without departing from the scope of the disclosure. In one exemplary aspect the solar cell 10a may overlap the solar cell 10b in a range of about 0 mm to about 1.5 mm. In other exemplary aspects, the solar cell 10a may overlap the solar cell 10b in a range of about 0.5 mm to about 1.5 mm. The amount of overlap may be determined based on various factors including, but not limited to, the total length of the overlapping solar cell, the weight or thickness of the solar cell, the materials used to connect the solar cell, the amount of flexibility required in the assembled hypercell, the shape of the overlapping solar cell edges (e.g. linear edges, non-linear, or "wavy" edges etc), the desired amount of front surface for sunlight exposure, the desired conductivity between adjacent solar cells 10, and the like.

Figure 2B:
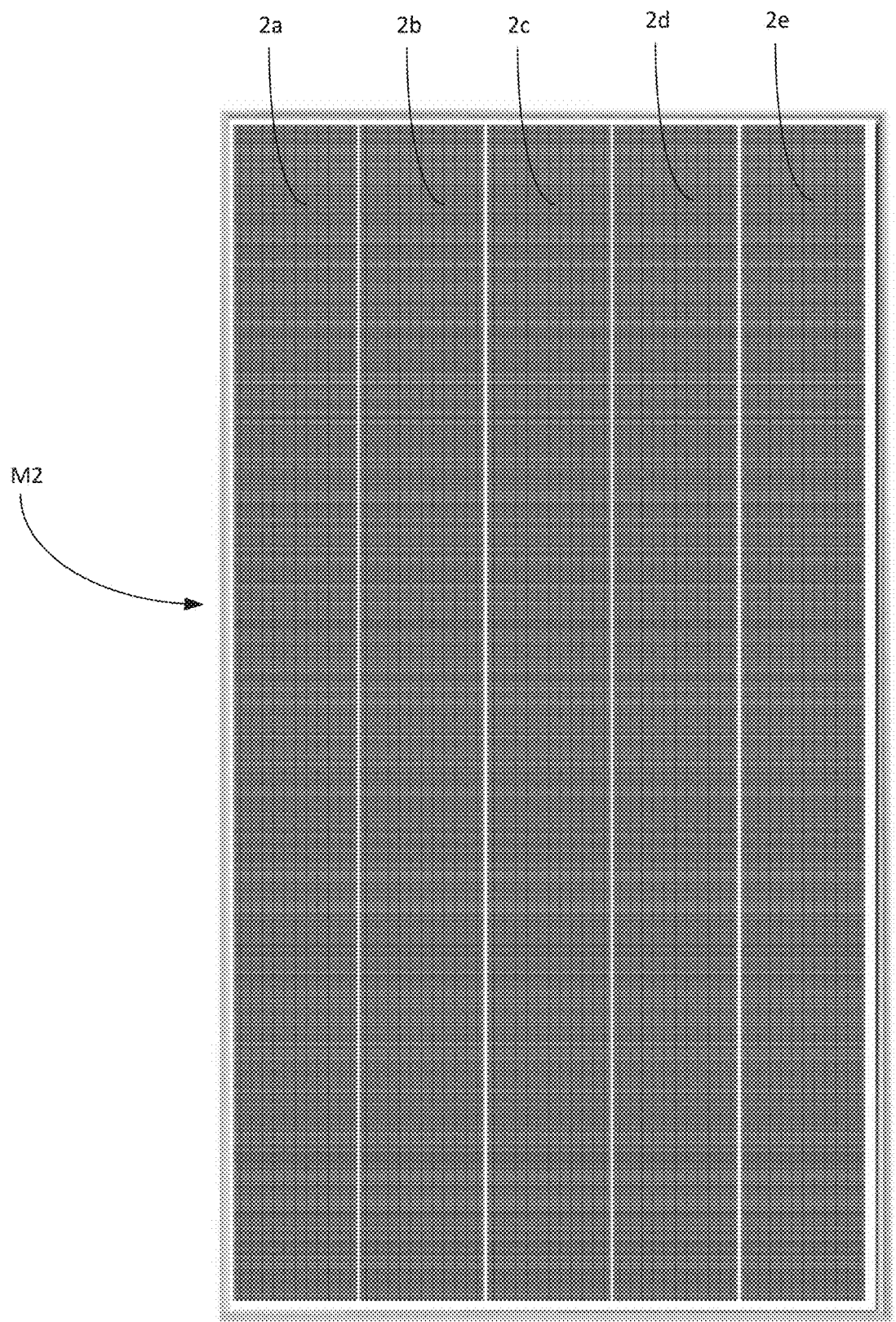
FIG. 2b illustrates a front view of a second solar module that includes multiple interconnected hypercells, according to exemplary aspects of the disclosure.

FIG. 2a illustrates a front (sun side) view of a first solar module M1 that includes multiple hypercells 1a, 1b, 1c, 1d, etc. (not all hypercells are labelled) electrically interconnected, according to exemplary aspects of the disclosure. The solar module M1 may include any number of interconnected hypercells. In the non-limiting example of FIG. 2a, six hypercells are depicted. FIG. 2b illustrates a front (sun side) view of a second solar module M2 that includes a total of five hypercells 2a, 2b, 2c, 2d, 2e electrically interconnected, according to exemplary aspects of the disclosure.

Figure 3:
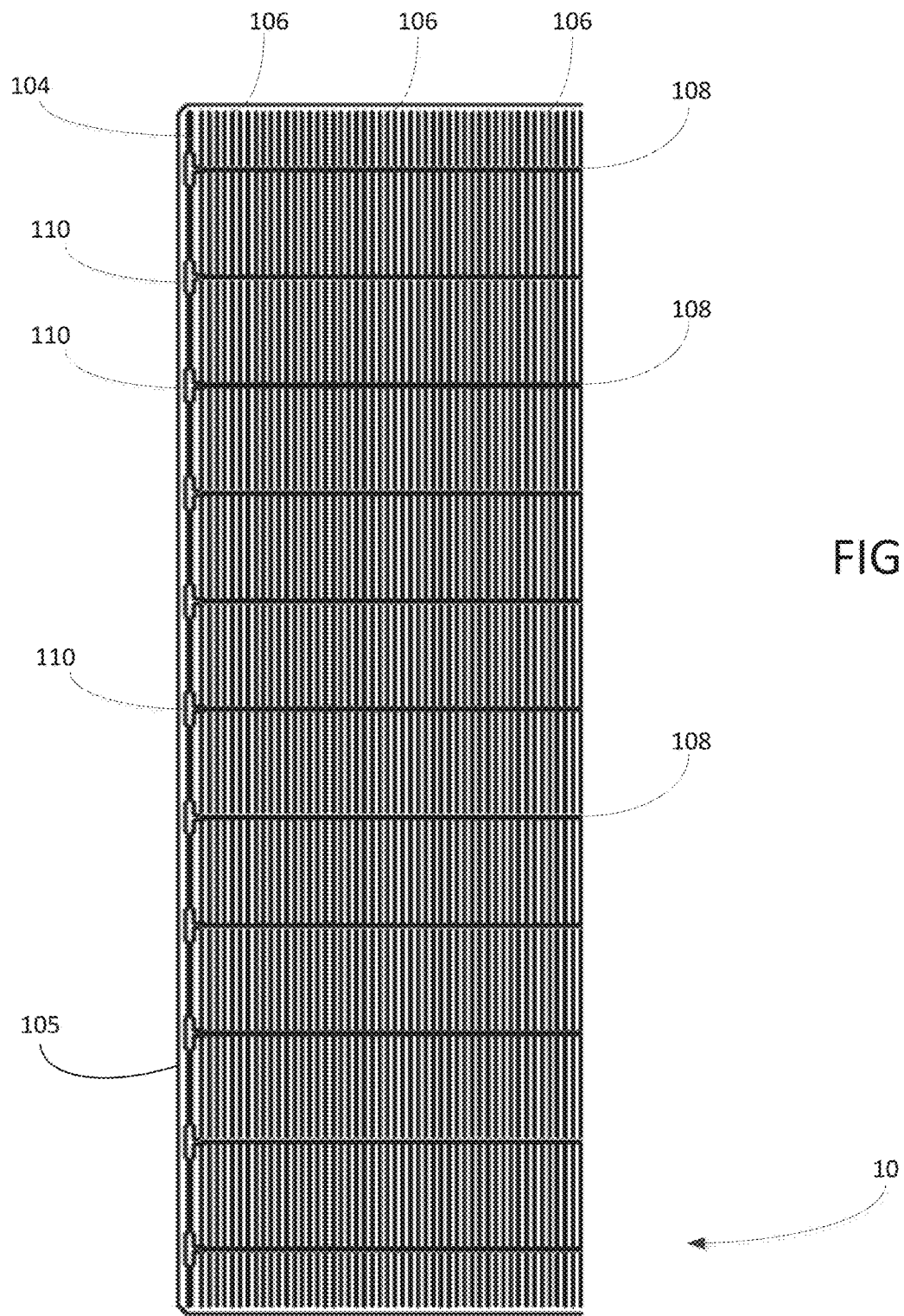
FIG. 3 illustrates a front metallization pattern of a hybrid dense solar cell, according to exemplary aspects of the disclosure.

FIG. 3 illustrates a front side metallization pattern of solar cell 10 according exemplary aspects of the disclosure. The solar cell 10 may include a semiconductor layer 102, a bus bar 104, fingers 106, and wires 108. Free electrons in the semiconductor layer move from the semiconductor layer through the fingers 106, to the wires 108, then to the bus bar 104. From the bus bar 104, the electrons may move to an adjacent connected solar cell, thus creating a current through hypercell 1. In some exemplary aspects, the bus bar 104 can be made of silver or tin material.

Figure 4A:
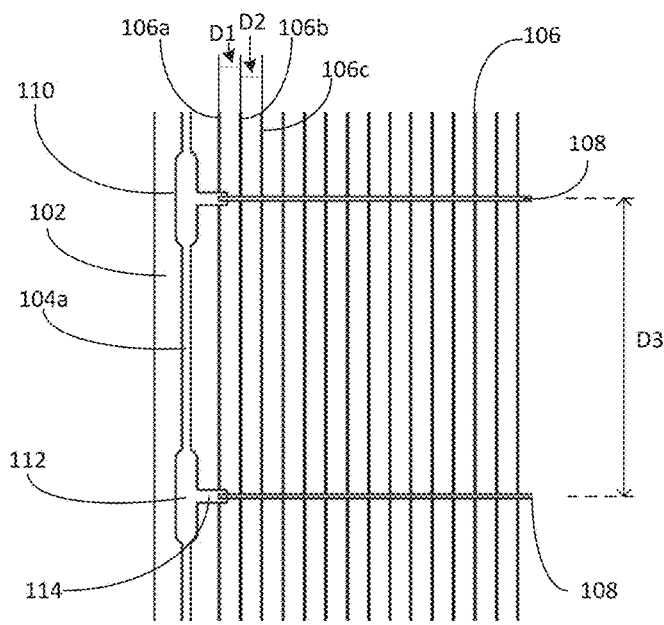
FIG. 4a is an enlarged view of a solar cell with a bus bar and loading pads, according to exemplary aspects of the disclosure.
Figure 4B:
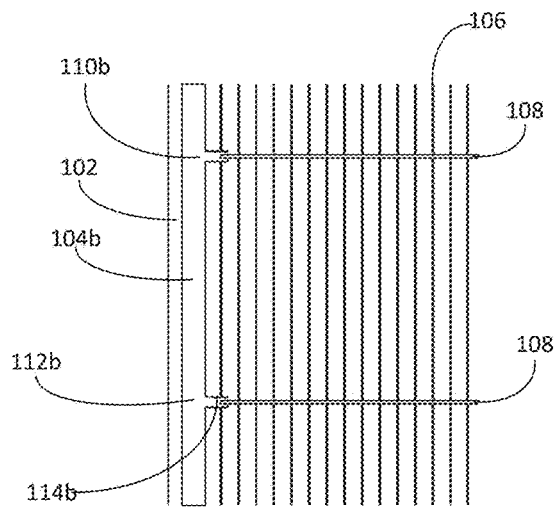
FIG. 4b is an enlarged view of a solar cell with a bus bar and loading pads, according to exemplary aspects of the disclosure.
Figure 4C:
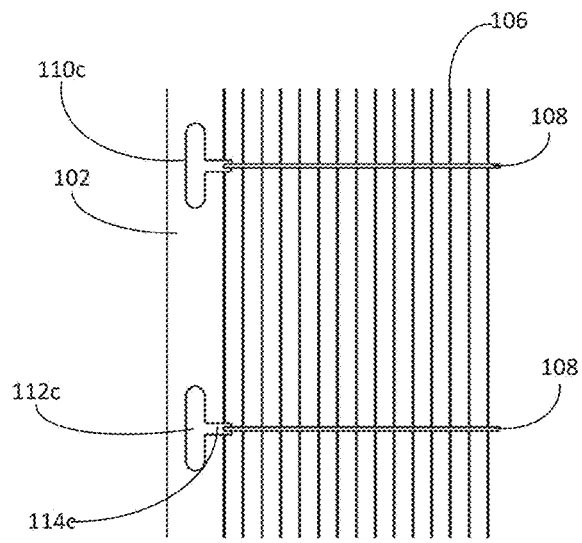
FIG. 4c is an enlarged view of a solar cell with loading pads only and no bus bar, according to exemplary aspects of the disclosure.

In one exemplary aspect, the front surface metallization patterns, including bus bar 104, discrete contact pads or loading pads 110, and/or fingers 106, may be formed, for example, from silver paste used for such purposes and deposited, for example, by screen printing methods. In one exemplary aspect a continuous bus bar having a continuous width along the edge of a solar cell can be used (as illustrated in FIG. 4b) instead of a combination of bus bar and loading pads having varied widths along the edges of the cell (as illustrated in FIG. 4a). In one exemplary aspect, some or all portions of the front surface metallization pattern may be formed from electroplated copper. In other exemplary aspects, other suitable materials and processes may be also used to form the metallization patterns. In one exemplary aspect in which the front surface metallization pattern is formed from silver, discrete front surface contact or loading pads 110 alone (as illustrated in FIG. 4c) can be used, rather than in combination with a continuous bus bar 104 along the edge of the cell, to reduce the amount of silver on the solar cell, which may advantageously reduce cost by reducing the amount of material used for the metallization pattern. In other exemplary aspects in which the front surface metallization pattern is formed from copper or from another conductor less expensive than silver, a continuous bus bar 104 with or without discrete contact or loading pads 110 could be employed without a cost disadvantage. Other conductive materials suitable to conduct the electrons from one solar cell to an adjacent connected solar cell may be used alone or in combination with bus bar 104 and/or loading pads 110. For example, electrically conductive adhesive ("ECA") may be used to form the bus bar 104 and/or loading pad 110 to perform the current collecting function of a bus bar, contact pad and/or loading pad.

In one exemplary aspect, the bus bar 104 can be printed onto the semiconductor layer using metal printing methods. In some exemplary aspects, the bus bar 104 may extend parallel to the fingers 102. Further, the bus bar 104 may include intermittently spaced loading pads 110 that may be used to connect adjacent solar cells 10 in a shingled arrangement (see FIG. 5). In some exemplary aspects, the loading pads 110 are made from substantially the same material as the bus bar 104. In other exemplary aspects, the loading pad 110 is made from a different material than the rest of the bus bar 104 or the loading pad 110 is partially made from the same or a different material as the bus bar 104. In some exemplary aspects, the bus bar and/or loading pads can be at least partially provided as an Electrically Conductive Adhesive ("ECA") such that the ECA performs some or all of the current collecting function of the bus bar and/or loading pads. In one exemplary aspect, the ECA can be various materials characterized by high electrical conductive properties can be used, and examples include silver pastes, acrylic-based conductive adhesives, and/or epoxy based conductive adhesives. In one exemplary aspect, the ECA can be an electrically and thermally conductive bonding material. For example, the ECA can have a thermal conductivity perpendicular to the solar cells greater than or equal to about 1.5 W/(meter-K). In one exemplary aspect, a combination of ECA materials can be applied and cured in the same bonding step. For example, a first ECA can have a shear modulus less than or equal to about 800 mega pascals and a second conductive adhesive can have a shear modulus of greater than or equal to about 2000 mega pascals can be applied and cured in the same bonding step. In one exemplary aspect, the conductive bonds between overlapping solar cells created by the ECA material also provide mechanical compliance to the super cells which accommodates a mismatch in thermal expansion between the hypercells for a temperature range of about −40° C. to about 105° C. without damaging the solar module.

In one exemplary aspect, the shingled configuration eliminates any physical gap between pairs of shingled solar cells 10. In one exemplary aspect, bus bar 104 and/or loading pads 110 are hidden beneath overlapping portions of adjacent solar cells in the shingled configuration. As a result, hypercell 1 is efficiently shaped to maximize the efficient use of space in a solar module, while maintaining high electrical conductivity along the length of the hypercell. In particular, a larger portion of the surface area of the hypercell is available to produce electricity (i.e. able to capture sunlight) than compared to tabbed solar cell arrangements and solar cell arrangements that include numerous visible bus bars or fingers on the illuminated surface of the solar cells.

FIG. 4a shows an enlarged view of a portion of the solar cell 10 shown in FIG. 3. As illustrated in FIG. 4a, the exemplary bus bar 104 includes loading pads 110 which have a larger width than the non-loading pad portions of the bus bar 104. The exemplary loading pads 110 may include a main portion 112 and an extending portion 114 that extends away from the main portion 112 and is at least substantially parallel to the wires 108. The main portion 112 may be rectangular shaped, circular shaped, oval shaped, or any other polygonal shape that allows the main portion 112 to support the load of an adjacent overlapping solar cell and to establish the desired electrical connection. Preferably, the main portion is substantially rectangular shaped and extends substantially parallel to the fingers 106 in the length direction of the main portion 112. The extending portion 114 extends substantially perpendicular to the main portion 112 and is substantially parallel to the wire 108. Although, the extending portion 114 is depicted as being substantially rectangular, other suitable shapes (e.g. oval, rounded, pointed, etc.) may be employed as well. The main portion 112 may be used to electrically connect adjacent solar cells (e.g. solar cells 10a, 10b) such that electrons can move from one solar cell to another to create an electrical current. The extending portion 114 may be used to electrically connect the loading pad 110 to an adjacent connecting wire 108. The extending portion 114 may extend to be in contact with the wire 108, as illustrated in FIG. 4a. Alternatively, the extending portion 114 may overlap with the wire 108 or a small gap may exist between the wire 108 and the extending portion 114. In the case where a gap may exist between the extending portion 114 and the wire 108, a further electrically conducting material (e.g. ECA) may be applied to electrically connect the extending portion 114 and the wires 108. Thus, the loading pad 110 may be used to electrically connect adjacent, overlapping solar cells 10 in the hypercell 1.

FIGS. 4b and 4c illustrate further configurations of the bus bar 104 and/or loading pads 110 according to exemplary aspects of the disclosure. As discussed above, FIG. 4b illustrates a solar cell 10 that includes a bus bar 104b that has a constant width such that the loading pads 110b and the bus bar have substantially the same width, except for areas of the loading pads where the extending portions 114b are located. Because the bus bar 104b and the loading pads 110b have substantially the same width, manufacturing time (and, therefore, costs) can be reduced since the bus bar 104b and loading pads 110b can be applied to the solar cell 10 in fewer steps due to the more uniform shape of the bus bar 104b (as compared to the bus bar 104 and loading pads 110 of the solar cell of FIG. 4a).

FIG. 4c illustrates a solar cell 10 having only loading pads 110c and no bus bar 104, according to one exemplary aspect of the disclosure. In the solar cell of FIG. 4c, no material is used to form a bus bar and, therefore, manufacturing costs can be reduced.

With reference to FIG. 3, fingers 106 may extend substantially parallel to the bus bar 104 and substantially parallel to the long edge 105 of the solar cell 10 (for example in the case where the solar cell 10 is substantially rectangular including short and long edges). Alternatively, the fingers 106 may extend at a slight angle to the bus bar 104 and/or the long edge 105 of the solar cell. For example, the slight angle may be an angle of 1 to 5 degrees. In some exemplary aspects, the fingers 106 may contact the bus bar 104. In other exemplary aspects, the each of the fingers 106 may be slight non-parallel to the other fingers. The fingers are configured to carry free electrons from the semiconductor layer to the wire 108. In some exemplary aspects, fingers 106 may be printed as a thin line onto the semiconductor layer and are made of silver material. However, other conductive materials (e.g. tin, copper, screen printed sliver, screen printed aluminum) may be used. In one exemplary aspect, the fingers 106 may be as thin as approximately 10 µm in width. In one exemplary aspect, the fingers can have widths in a range of about 10 µm to about 90 µm, or a range of about 40 µm to about 50 µm. In one exemplary aspect, the finger height is in a range of from about 10 µm to about 30 µm. Alternatively, the fingers 106 may be wider to increase conductivity.

The fingers 106 extend substantially across the entire length of the solar cell 10. In some exemplary aspects the fingers 106 may be broken up such that a first finger 106 extends only partially across the length of the solar cell 10 and a second finger, which may or may not be connected to the first finger, extends the remaining length of the solar cell 10. Further, the fingers 106 may be evenly spaced across the semiconductor layer to provide even capture of free electrons in the semiconductor layer 102. Alternatively, the fingers 106 may be placed at different distances from each other without departing form the scope of this disclosure. For example, a first finger 106a may be spaced at a first distance D1 from an adjacent second finger 106b which may be spaced from a third finger 106c at second distance D2 that is different than the first distance D1 (see FIG. 4a). In some exemplary aspects, the first distance D1 and/or second distance D2 are in a range of about 1.2 mm to about 2 mm. In other exemplary aspects, the first distance D1 and/or second distance D2 are in a range of about 0.624 mm to about 0.780 mm. In some exemplary aspects, the fingers 106 can be provided with a smaller spacing (e.g. D1, D2) between adjacent fingers relative to the spacing D3 between adjacent wires 108. For example, a ratio between finger spacing D1/D2 to wire spacing D3 can be between about 20:1 to about 5:1. In the non-limiting example of FIG. 3a, the ratio of spacing between fingers 106 and wires 108 is approximately 15:1.

The exemplary approaches described herein can advantageously reduce cost by reducing the amount of material used for efficient conduction of current along a solar cell string or hypercell. For example, the wires 108 can be formed as copper wire or ribbon (or from another conducting material less expensive than silver) to reduce the Rs of series resistance in the solar cell string, thereby improving power of the solar module and reducing cost via reduction in silver consumption. The exemplary approaches described herein can also advantageously enable high power, low cost solar modules including shingling solar cells interconnected in series via an ECA in combination with wires extending along one or more hypercells of the solar module.

As illustrated in FIGS. 3 and 4a-4c, solar cell 10 may further include wires 108 which extend substantially perpendicularly to the fingers 106, the bus bar 104 and/or the long edge of the solar cell 10. The wires 108 may be attached, via printing or other application process, on top of the fingers 106 such that the wires 108 and fingers 106 are electrically connected. In other exemplary aspects, the wires can be glued by ECA via IR or hot air; soldered by induction soldering; or if the wire has low temperature coating (e.g. tin-bismuth or the like), the wire can be attached by hot air or from the temperature of the heated laminate during lamination of the hypercell. Thus, the wires 108 may not include any sheathing or covering that would prevent an efficient electrical connection to the fingers 102 or the loading pad 110. Further, the wires 108 may extend to and may be in electrical connection with the bus bar 104 through the loading pads 110. Thus, the wires 108 provide an electrical connection between the fingers 106 and the bus bar 104 such that free electrons in the semiconductor layer may travel from the fingers 106 through the wires 108 and to the bus bar 104 to create an electric current.

The wires 108 connect to the extending portion 114 of the loading pad 110. In some exemplary aspects, the wires 108 may connect to the loading pad 110 through direct overlapping physical contact. In other exemplary aspects, the wire 108 and the loading pad 110 may be in abutting connection with each other to create an electrical connection. In other exemplary aspects, the wire 108 and loading pad 110 may not be in direct physical contact and an additional material (such as ECA) may be used to establish the electrical connection between the loading pad 110 and the wire 108. In some exemplary aspects, wires 108 are made of copper. In other exemplary aspects, the wires 108 are made of other electrically conductive materials including, but not limited to, gold, silver, tin, or the like.

Figure 5:
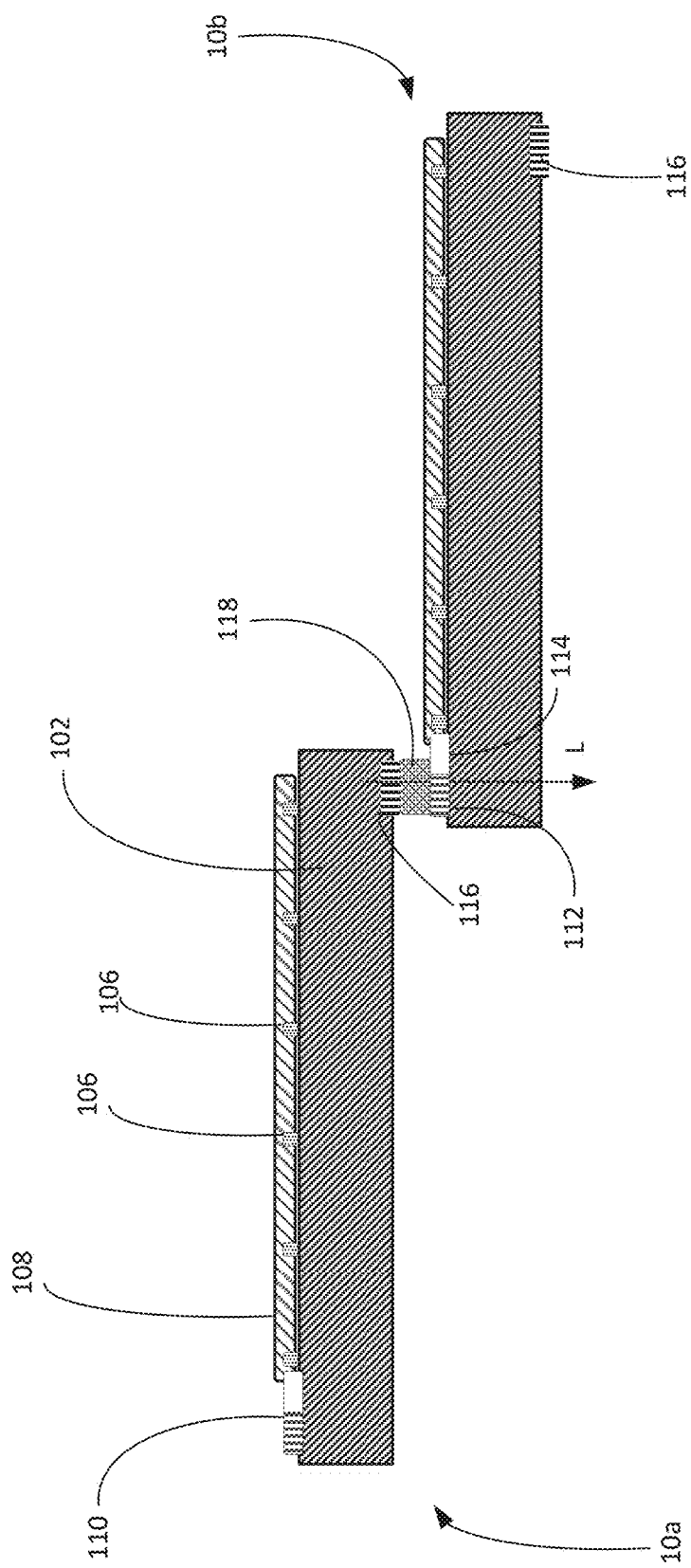
FIG. 5 is a cross sectional view of two hybrid dense solar cells attached in a shingled arrangement, according to exemplary aspects of the disclosure.

FIG. 5 illustrates an enlarged cross section of overlapping solar cells 10a, 10b, according to one exemplary aspect of the disclosure. In FIG. 5, the wire 108 does not extend completely to the main portion 112 of the loading pad 110. Instead, the wire 108 is in contact with the extending portion 114 of the loading pad 110. Due to this configuration, the wire 108 receives substantially no load force L from the overlapping solar cell 10a. In other words, the overlapping solar cell 10a does not contact and load the wires 108 from above. In this way, the solar cells 10a and 10b are advantageously protected from cracking or breakage due to concentrations of the weight of the overlapping solar cell 10a on specific points. In other words, because the wire 108 is not underneath the overlapping solar cell 10a, the weight of the solar cell 10a is evenly spread amongst the loading pads and point loads (e.g. on the wires or on the bottom of the overlapping solar cell 10a) can be substantially avoided. Thus, a longer service life of the hypercell 1 can be achieved by preventing unnecessary breakage. It is noted that that in some exemplary aspects, the wire 108 may extend slightly under the overlapping solar cell 10a so long as substantially no load force L is transferred to the wires 108, without departing from the scope of the disclosure.

Further, FIG. 5 illustrates that the solar cells 10a, 10b may further include loading pads 116 on a bottom side of the semiconductor layer 102. The loading pads 116 may be made of the same or a different material than the loading pads 110. Further, ECA material may be used to attach the solar cells 10a, 10b to each other. Thus, the loading pads 110, 116 and the ECA 118 work in conjunction to electrically connect solar cell 10a and solar cell 10b. In one exemplary aspect, a distance H between overlapping solar cells 10a, 10b is in a range from about 40 μm to about 100 μm.

Figure 6:
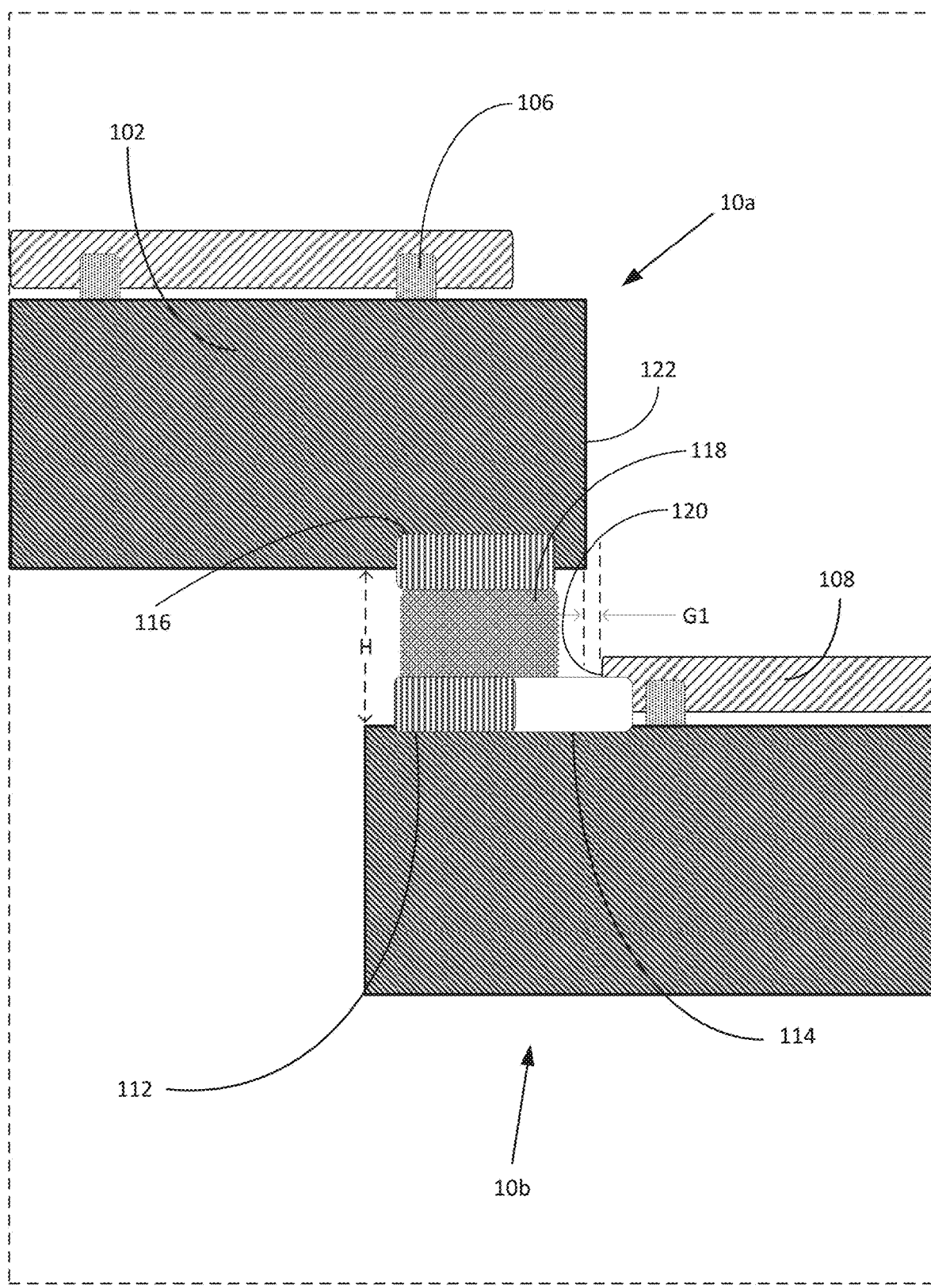
FIG. 6 is an enlarged view of the overlapped portions of the hybrid dense solar cells of FIG. 5 and in accordance with exemplary aspects of the disclosure.

FIG. 6 is an enlarged view of cross section shown of FIG. 5. In FIG. 6, solar cell 10a includes an overlapping edge 122 which is positioned above solar cell 10b. Further, wire 108 of solar cell 10b includes edge 120 which terminates on or near to the extending portion 114 of the loading pad 110. In FIG. 6, a gap G is depicted between overlapping edge 122 of solar cell 10a and edge 120 of the wire 108. Gap G1 ensures that the load force from solar cell 10a does not transfer to solar cell 10b in an even that, for example, the ECA 118 is compressed and the solar cell 10a moves toward the solar cell 10b. In some exemplary aspects, the gap may be substantially zero such that the overlapping edge 122 and 120 are substantially aligned in the same plane. In other exemplary aspects, the gap may be a negative gap such that the wire 108 is positioned slightly underneath solar cell 10a, but is still protected from damage from the solar cell 10a due to other mechanisms.

With reference to FIG. 7, in some exemplary aspects, the wires 108a may have a circular cross-sectional shape. The circular shape is easy to manufacture, as wires are typically produced with circular cross sections. Thus, the circular cross sectional shape offers a cost-effective option for the wires 108.

Figure 8:
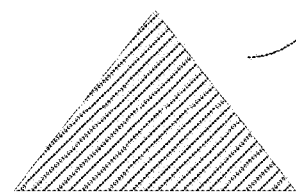
FIG. 8 illustrates a triangular cross sectional shape of a wire, according to exemplary aspects of the disclosure.

With reference to FIG. 8, in some exemplary aspects, the wires 108b may have a triangular cross-sectional shape. In addition to providing a high conductivity, the triangular wires 108b provide improved efficiency to the solar cell 10 by reflecting light towards the semiconductor material (see FIG. 9).

FIG. 9 is an enlarged cross sectional view of a solar cell 10 according to exemplary aspects of the disclosure. In FIG. 9, light rays R deflect off of the triangular shaped wire 108b and are directed toward the semiconductor layer 102. Thus, light that would normally be blocked by the wires 108 on top of the semiconductor layer 102 is at least partially redirected toward the semiconductor layer 102. Accordingly, more light being directed to the semiconductor layer 102 results in more electrons being freed and the efficiency of the solar cell 10 is improved.

Figure 10:
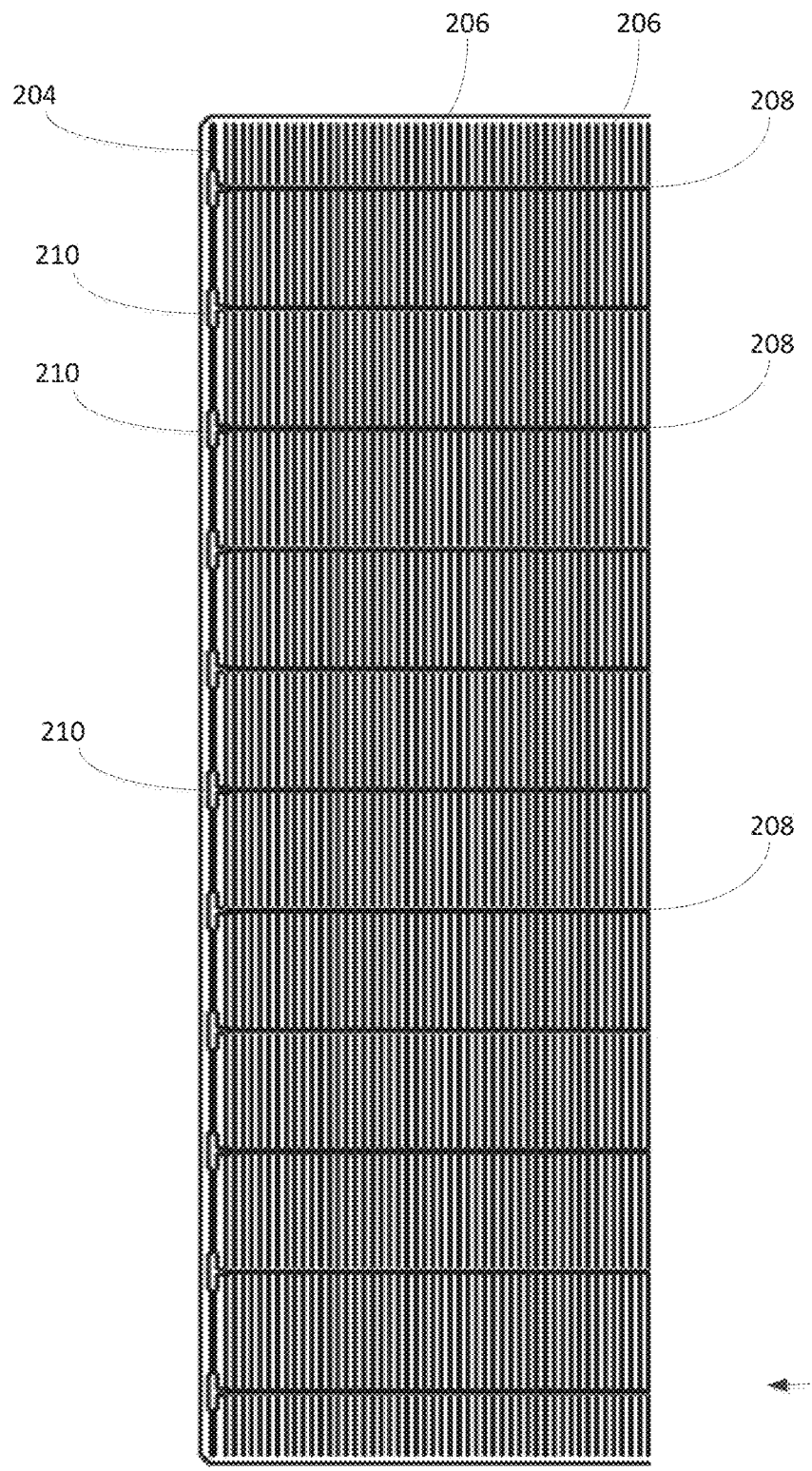
FIG. 10 illustrates a front metallization pattern of a hybrid dense solar cell, according to exemplary aspects of the disclosure.
Figure 11:
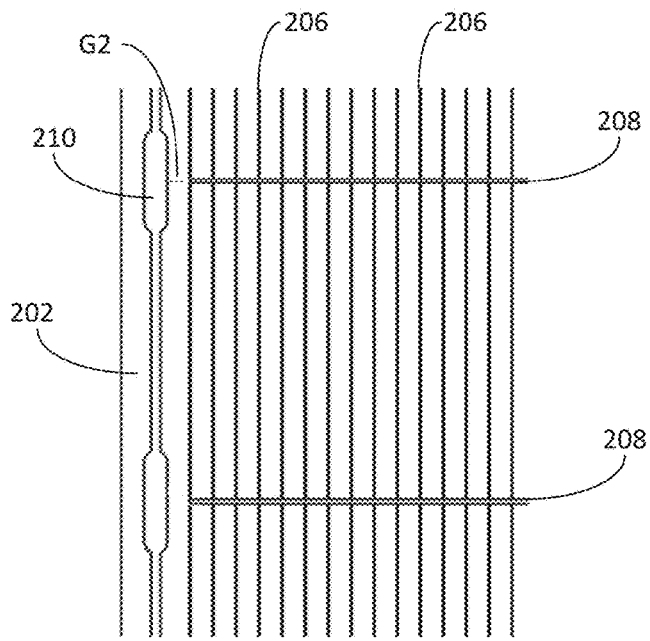
FIG. 11 is an enlarged view of the hybrid dense solar cell of FIG. 10 prior to attaching the wires, and in accordance with exemplary aspects of the disclosure.
Figure 12:
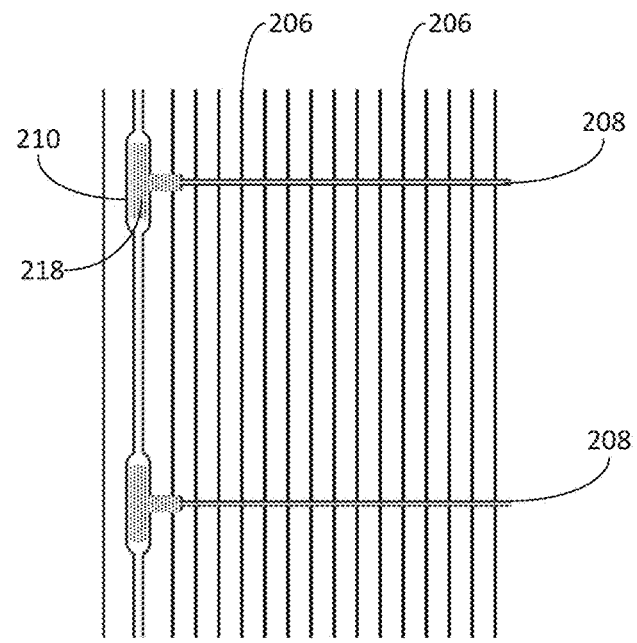
FIG. 12 is an enlarged view of the hybrid dense solar cell of FIG. 10 after the wires are attached, according to exemplary aspects of the disclosure.

FIGS. 10-12 illustrate a front side metallization pattern of solar cell 20 according to exemplary aspects of the disclosure. The solar cell 20 may include a semiconductor layer 202, a bus bar 204, fingers 206, wires 208, loading pads 210, 216, and ECA 218.

Solar cell 20 differs from solar cell 10 in that the loading pad 210 of solar cell 20 does not directly contact the wire 208 to establish an electrical connection. FIG. 11 illustrates solar cell 20 prior to applying ECA material 218 to the semiconductor layer 202 in order to create an electrical connection between the loading pad 210 and wire 208. In FIG. 11, a gap G2 is left between the loading pad 210 and the wire 208. Gap G2 can be as large as the distance from loading pad 210 to the next adjacent finger 206 or the end of the wire 208 can be positioned much closer to the loading pad 210 without departing from the scope of the disclosure. In one exemplary aspect, the wires 208 overlap the loading pads in a range of about 0.5 mm to about 1 mm.

FIG. 12 illustrates solar cell 20 after the ECA material 218 has been applied via printing (e.g. screen printing or inkjet printing), or other ECA application or dispensing process (e.g. jetting, dispensing via pneumatic/mechanical screw system, etc.) over the loading pad 210 and wire 208. Thus, the solar cell 20 can be produced using less of the material used to for the loading pad 210. Since the loading pad 210 may be made of silver metal, the ECA 218 is typically a less costly material to use. Therefore, using the ECA 218 to connect the loading pad 210 and the wire 208 may result in reduced manufacturing costs of the solar cell 20, while the ECA still functions as a highly conductive connection between overlapped solar cells in the hypercell 1.

Figure 13:
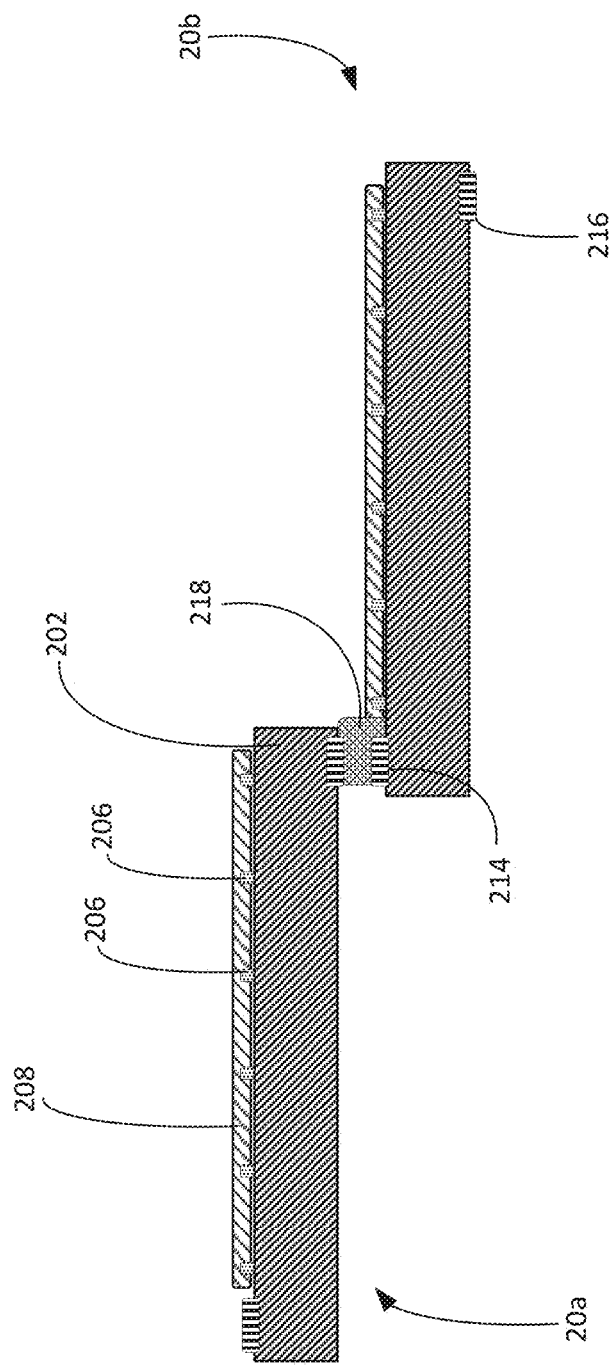
FIG. 13 is a cross sectional view of two hybrid dense solar cells attached in a shingled arrangement, according to exemplary aspects of the disclosure.

FIG. 13 illustrates an enlarged cross section of overlapping solar cells 20a, 20b, according to exemplary aspects of the disclosure. In FIG. 13, and as described above, the wires 208 may not extend all the way to the bus bar 210 such that the wire 208 does not receive any load from the overlapping solar cell 20a. In other words, the overlapping solar cell 20a may not cover the wires 208 from above. In this way, the wires 208 are advantageously protected from cracking or breakage due to the weight of the overlapping solar cell 20a. Thus, a longer life of the solar cell 20 can be achieved by preventing unnecessary breakage.

Further, FIG. 13 illustrates that the solar cells 20a, 20b may further include loading pads 216 on a bottom side of the semiconductor layer 202. Further, ECA material 218 may be used to attach the solar cells 20a, 20b to each other. In FIG. 13, the ECA material 218 is also used to electrically connect the loading pad 210 and the wire 208. Thus, the loading pads 110, 116 and the ECA 218 work in conjunction to electrically connect solar cell 20a and solar cell 20b.

Figure 14:
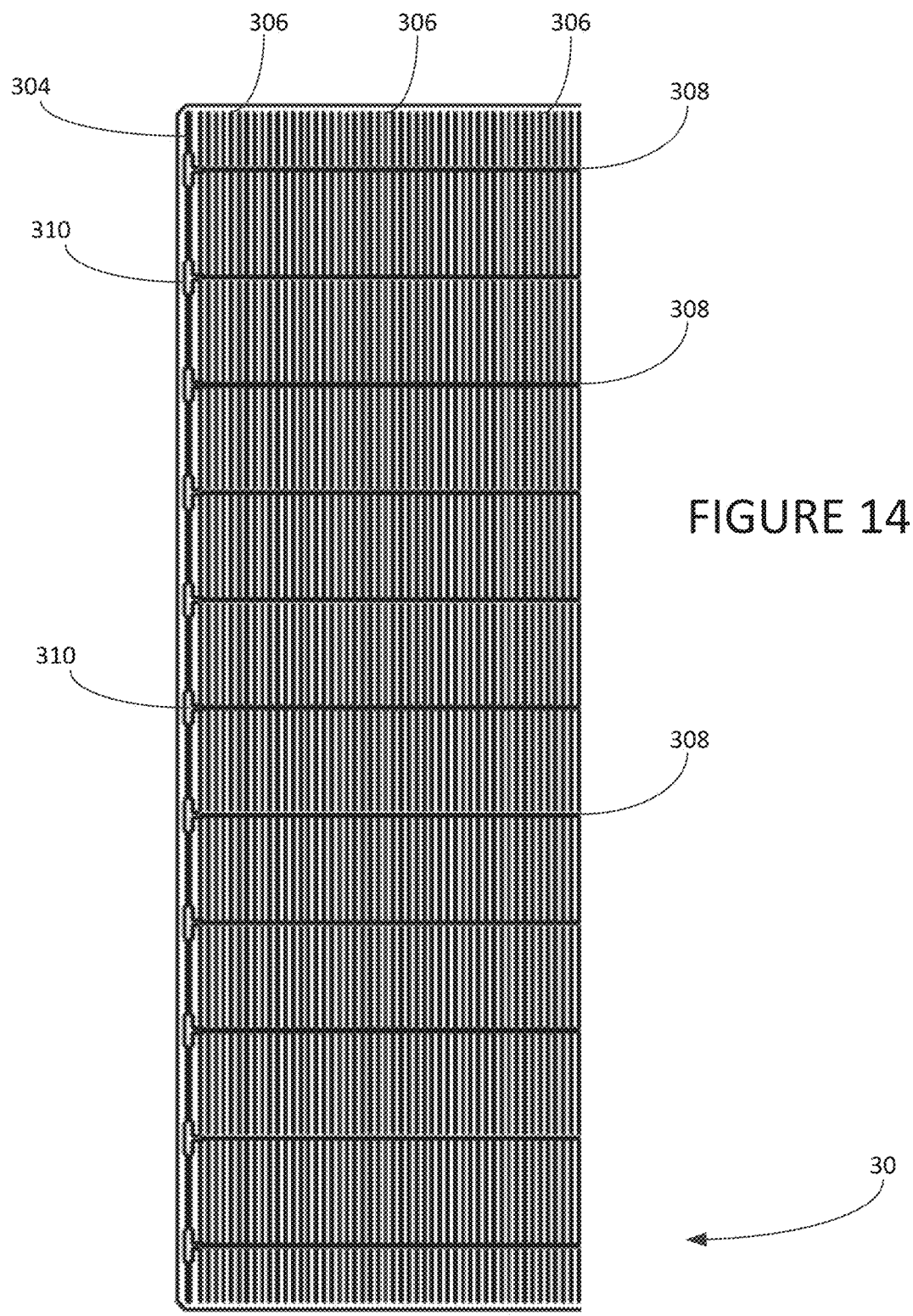
FIG. 14 illustrates a front metallization pattern of a hybrid dense solar cell, according to exemplary aspects of the disclosure.
Figure 15:
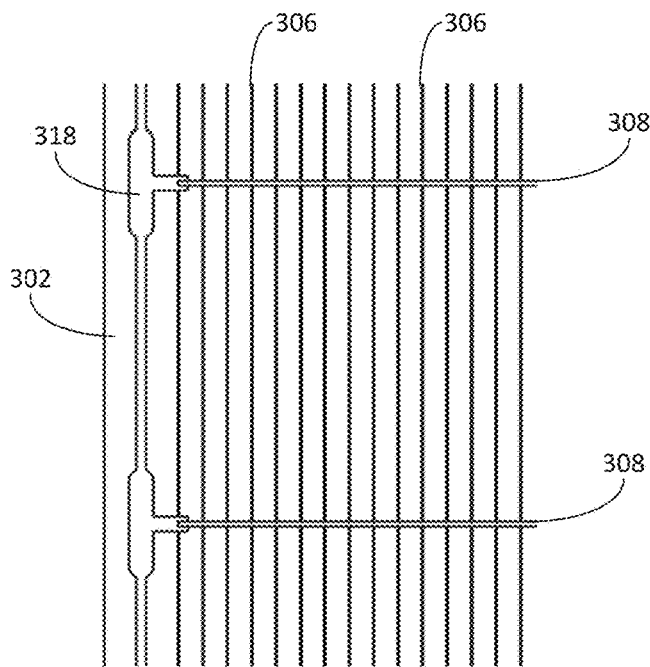
FIG. 15 is an enlarged view of the hybrid dense solar cell of FIG. 14, according to exemplary aspects of the disclosure.
Figure 16:
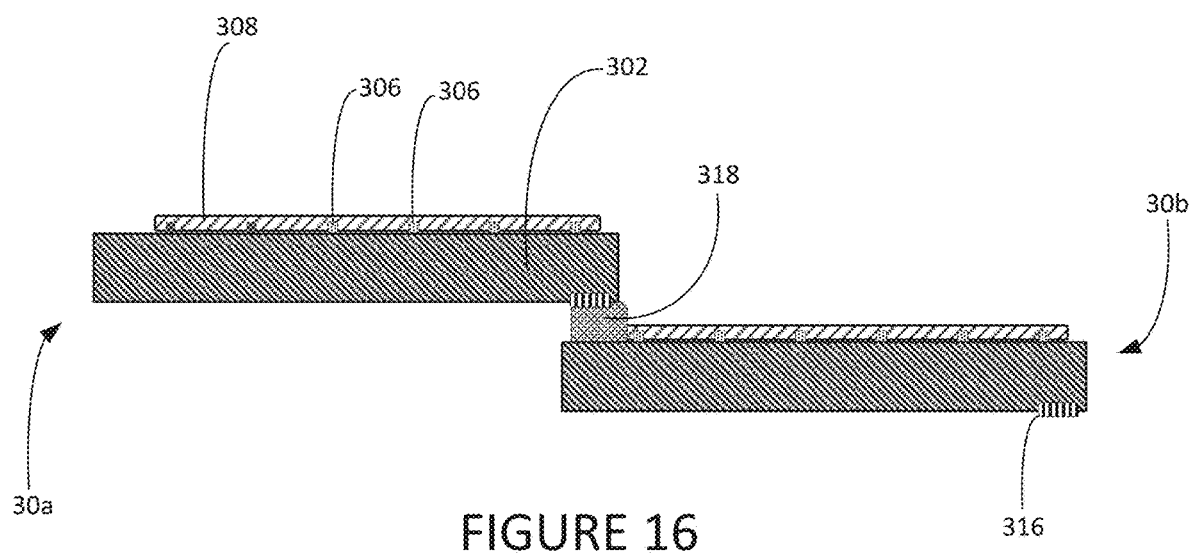
FIG. 16 shows cross sectional view of two hybrid dense solar cells attached in a shingled arrangement and in accordance with exemplary aspects of the disclosure.

FIGS. 14-16 illustrate a front side metallization pattern of solar cell 30 according to exemplary aspects of the disclosure. The solar cell 30 may include a semiconductor layer 302, a bus bar 304, fingers 306, wires 308, loading pads 310, 316, and ECA 318.

Solar cell 30 differs from solar cells 10, 20 in that the bus bar 304 and loading pad 310 of solar cell 30 are both made of ECA 318. Thus, FIGS. 14-16 illustrate that metal, such as silver metal, is not used to form the bus bar 304, the loading pads 310, or both. Since the cost of silver for use in solar cells is significantly greater than the cost of ECA material, solar cell 30 can be manufacturing for significantly less cost.

Figure 17:
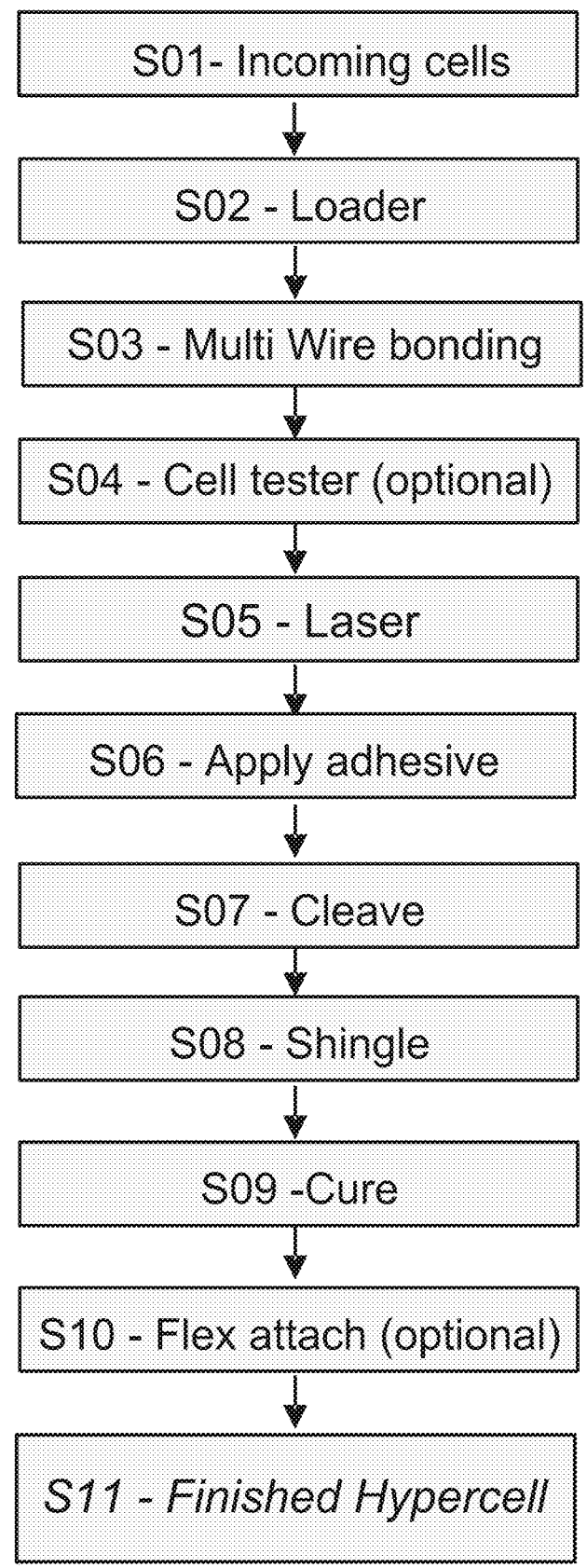
FIG. 17 is a block diagram of a method of manufacturing a hypercell, according to exemplary aspects of the disclosure.

FIG. 17 is a block diagram of a method of manufacturing the solar cells 10, 20, 30, etc. according to exemplary aspects of the disclosure. In FIG. 17, at step S01, incoming cell wafers that have the bus bars and fingers pre-attached are received. At step S02 the cells are loaded into a wire printing/applying machine. At step S03, the wires are attached to the received cells via IR soldering or similar method of attaching the wires. In this step, the wires may have a low temperature soldering coating that is heated to attach the wires. At step S04, the cells may be tested using a Grid TOUCH contacting system like Meyer Burger's tester. In other exemplary aspects, the cells may be tested using copper ribbons. At step S05, a laser is used to heat the soldering coating and attach the wires to the received cells. Due to the wires including a low temperature solder coating, etching of the fingers or the semiconductor layer below the wires due to heat from the laser can be avoided. At step S06, the ECA is printed onto the solar cell wafer. At step S07 the wafers are cleaved to form the individual solar cells 10. In one exemplary aspect, the wafers are crystalline silicon wafers that are cleaved into individual crystalline silicon solar cells or substantially rectangular strips. At step S08 the solar cells 10 are arranged in a shingled arrangement (as shown in FIG. 1) to form the shingled hypercell. At step S09, the cells are heating in an oven for a predetermined amount of time to cure the ECA. At step S10, a Flex Attachment process can be optionally performed in which a copper ribbon is attached along one end of an illuminated side of the hypercell and extending across each of the solar cells 10. In one exemplary aspect, the Flex Attachment process can be performed via an automated process or manual process. In one exemplary aspect, the copper ribbons can be attached using manual soldering, IR soldering, or ECA. At step S11, manufacturing of the finished shingled hypercell 1 is completed.

Figure 18:
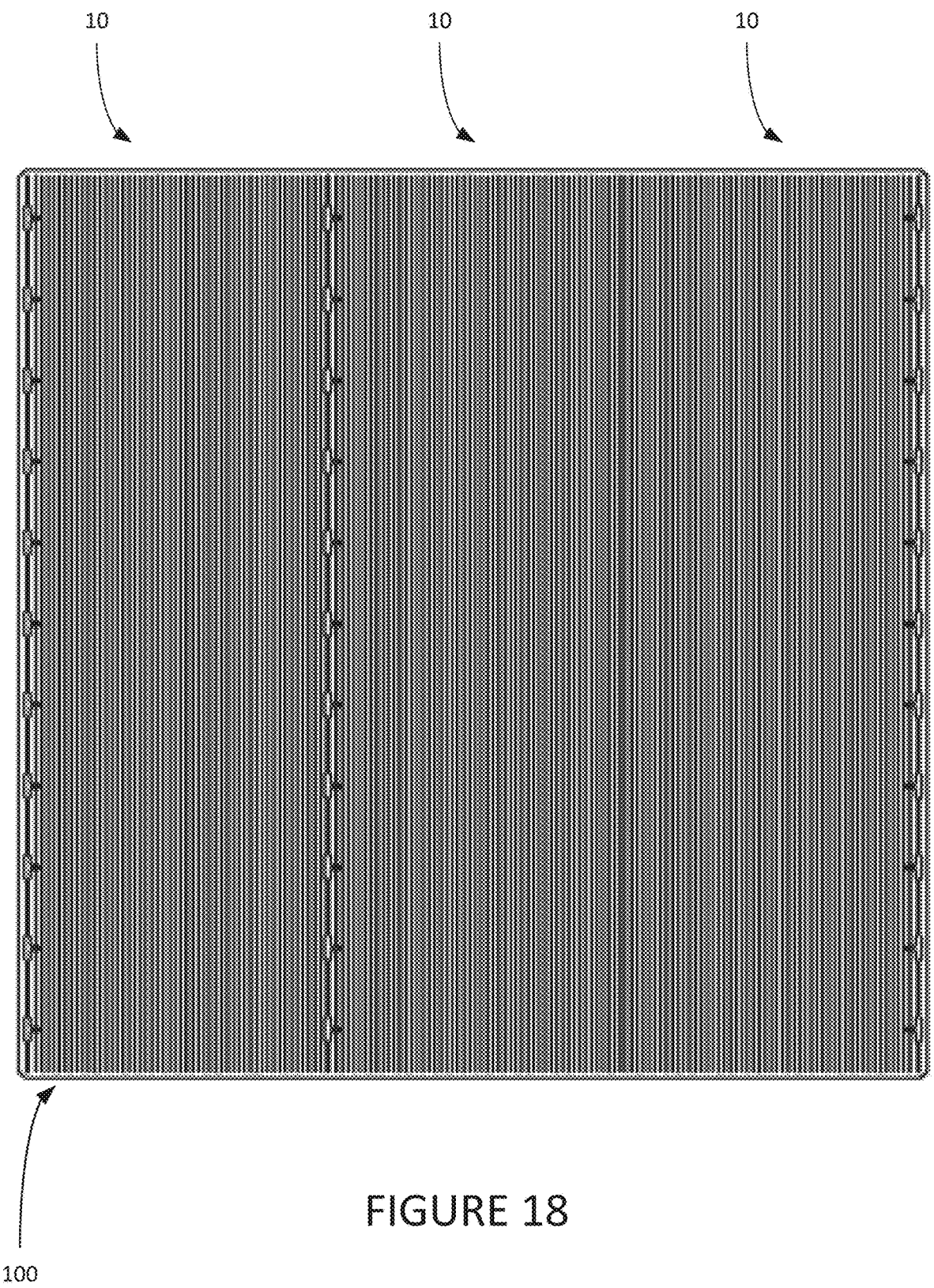
FIG. 18 illustrates a hybrid dense solar cell wafer that includes a several hybrid dense solar cells before wire attachment, according to exemplary aspects of the disclosure.
Figure 19:
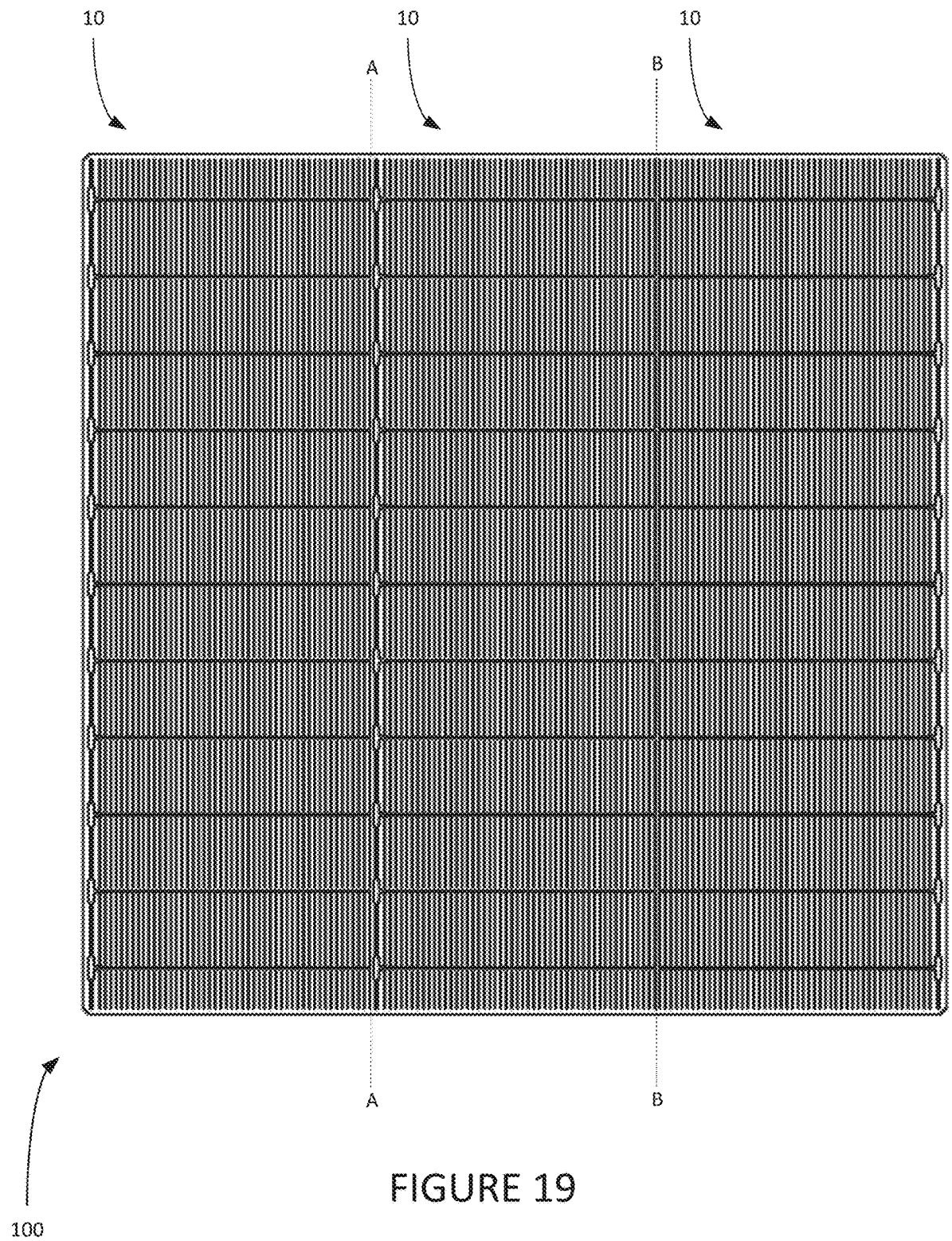
FIG. 19 illustrates a hybrid dense solar cell wafer that includes a several hybrid dense solar cells with wire attachment, according to exemplary aspects of the disclosure.

FIG. 18 illustrates a hybrid dense solar cell wafer 100 prior to attaching the wires, according to exemplary aspects of the disclosure. FIG. 19 illustrates the hybrid dense solar cell wafer 100 of FIG. 18 after the wires 108 have been attached to the wafer 100. In one exemplary aspect, the solar cells 10 may be formed by cleaving the solar cell wafer 100 (e.g. at step S07) along the cleave lines A-A and B-B (illustrated as dotted lines in FIG. 19). The solar cell wafer 100 may also be cut, broken, or otherwise divided to form the rectangular solar cells 10. In FIG. 19, the solar cell wafer includes the metallization patterns for each of the solar cells 10, including the respective bus bars, fingers, loading pads, and wires.

In the non-limiting exemplary aspects illustrated in FIG. 18 and FIG. 19, the solar cell wafer includes a metallization pattern that can be preferably cleaved into three smaller rectangular solar sub-cells or strips. However, in some exemplary aspects, the metallization pattern can be modified such that the solar cell wafer is preferably cleaved into any desirable number of solar sub-cells. For example, the wafer can be cleaved into a number of sub-cells ranging from 2 to 20 sub-cells without departing from the spirit of the disclosure.

Obviously, numerous modifications and variations of the present invention are possible in light of the above teachings. It is therefore to be understood that within the scope of the appended claims, the invention may be practiced otherwise than as specifically described herein.

The invention claimed is:

1. A solar module, the solar module comprising:
at least one first solar cell and at least one second solar cell, each including:
a substrate including a top side and bottom side,
a metallization pattern on the top side including a bus bar, top side loading pads, and fingers, wherein the bus bar extends along a first direction and electrically connects the top side loading pads to each other, and the fingers extend along the first direction,
a plurality of wires, disposed on the top side, each extending in a second direction perpendicular to the first direction, each being spaced apart from one of the top side loading pads such that a gap exists between each of the plurality of wires and a closest one of the top side loading pads, and each being connected to the fingers, and
bottom side loading pads on the bottom side, the bottom side loading pads being spaced apart from the top side loading pads,
wherein an uppermost face of an electrically conductive adhesive directly contacts the bottom side of the substrate and the bottom side loading pads of the first solar cell and a lowermost face of the electrically conductive adhesive directly contacts the top side of the substrate and the top side loading pads of the second solar cell to electrically connect the first solar cell to the second solar cell in an overlap region,
wherein the bottom side of the first solar cell overlaps the overlap region on the top side of the second solar cell to electrically connect to the second solar cell and to form a shingled arrangement, and
wherein the electrically conductive adhesive extends from each one of the top side loading pads to a closest wire of the plurality of wires to electrically connect the top side loading pads to the plurality of wires.

2. The solar module according to claim 1, wherein the bus bar of the first solar cell and the bus bar of the second solar cell are composed of a first metal and the plurality of wires are composed of a second metal different than the first metal.

3. The solar module according to claim 1, wherein the plurality of wires are made of copper metal or alloys thereof.

4. The solar module according to claim 1, wherein the bus bar is made of silver metal or alloys thereof.

5. The solar module according to claim 1, wherein the plurality of wires have an electrical resistance that is smaller than an electrical resistance of the fingers.

6. The solar module according to claim 1, wherein the fingers are composed of a first metal and the plurality of wires are composed of a second metal different than the first metal.

7. The solar module according to claim 1, wherein spacing between the fingers is smaller than a spacing between adjacent wires of the plurality of wires.

8. The solar module according to claim 1, wherein each of the plurality of wires has a circular cross sectional shape.

9. The solar module according to claim 1, wherein each of the plurality of wires has a triangular cross sectional shape.

10. The solar module according to claim 9, wherein each wire of the plurality of wires is oriented to contact the plurality of fingers with a base of the triangular cross-sectional shape.

11. The solar module according to claim 1, wherein, in each solar cell, the plurality of wires extend substantially perpendicular to the bus bar.

12. The solar module according to claim 1, wherein the electrically conductive adhesive is a silver paste, an acrylic-based conductive adhesive, and/or epoxy based conductive adhesive.

13. A method of manufacturing a solar module, the method comprising:
    providing at least one first solar cell and at least one second solar cell, each including:
        a substrate including a top side and bottom side,
        a metallization pattern including on the top side a bus bar, top side loading pads, and fingers, wherein the bus bar extends along a first direction and electrically connects the top side loading pads to each other, and the fingers extend along the first direction,
        a plurality of wires, disposed on the top side, each extending in a second direction perpendicular to the first direction, each being spaced apart from one of the top side loading pads such that a gap exists between each of the plurality of wires and a closest one of the top side loading pads, and each being connected to the fingers, and
        an uppermost face of an electrically conductive adhesive directly contacts the bottom side of the substrate and bottom side loading pads of the first solar cell and a lowermost face of the electrically conductive adhesive directly contacts the top side of the substrate and the top side loading pads of the second solar cell to electrically connect the first solar cell to the second solar cell in an overlap region, and
        the bottom side loading pads of the first solar cell being spaced apart from the top side loading pads of the second solar cell; and
    arranging the bottom side of the first solar cell to overlap the overlap region on the top side of the second solar cell to electrically connect to the second solar cell and to form a shingled arrangement,
    wherein the electrically conductive adhesive extends from each one of the top side loading pads to a closest wire of the plurality of wires to electrically connect the top side loading pads to the plurality of wires.

14. The method of manufacturing a solar module according to claim 13, further comprising attaching each wire of the plurality of wires to the respective solar cell using infrared radiation (IR) soldering.

15. The method of manufacturing a solar module according to claim 13, further comprising printing electrically conductive adhesive over the plurality of wires to attach each of the plurality of wires to the respective solar cell.

16. The method of manufacturing a solar module according to claim 13, further comprising:
    coating each of the plurality of wires with a coating material; and
    heating the coating material to attach the plurality of wires to the solar cell.

* * * * *